(12) United States Patent
Toyoda et al.

(10) Patent No.: US 10,943,806 B2
(45) Date of Patent: Mar. 9, 2021

(54) SUBSTRATE PROCESSING APPARATUS, METHOD OF MANUFACTURING SEMICONDUCTOR DEVICE, AND NON-TRANSITORY COMPUTER-READABLE RECORDING MEDIUM

(71) Applicant: KOKUSAI ELECTRIC CORPORATION, Tokyo (JP)

(72) Inventors: Kazuyuki Toyoda, Toyama (JP); Kazuhiro Yuasa, Toyama (JP); Tetsuo Yamamoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 9 days.

(21) Appl. No.: 16/103,611

(22) Filed: Aug. 14, 2018

(65) Prior Publication Data

US 2019/0006218 A1 Jan. 3, 2019

Related U.S. Application Data

(63) Continuation of application No. PCT/JP2016/055222, filed on Feb. 23, 2016.

(51) Int. Cl.
*H01L 21/677* (2006.01)
*H01L 21/67* (2006.01)
(Continued)

(52) U.S. Cl.
CPC ........ *H01L 21/67754* (2013.01); *C23C 16/46* (2013.01); *H01L 21/67017* (2013.01);
(Continued)

(58) Field of Classification Search
CPC ....... H01L 21/67754; H01L 231/67017; H01L 2/67115; H01L 21/67167; H01L 21/6719;
(Continued)

(56) References Cited

U.S. PATENT DOCUMENTS 5,963,823 A 10/1999 Yamamzaki et al.
2003/0101612 A1 6/2003 Granneman et al.
(Continued)

FOREIGN PATENT DOCUMENTS

JP 61-32418 A 2/1986
JP 07-115069 A 5/1995
(Continued)

OTHER PUBLICATIONS

Japanese Office Action dated Oct. 10, 2019 for the Japanese Patent Application No. 2018-501447.
(Continued)

*Primary Examiner* — Sue A Purvis
*Assistant Examiner* — Scott Stowe
(74) *Attorney, Agent, or Firm* — Volpe Koenig

(57) ABSTRACT

A substrate processing technique includes: a first heating device configured to heat a substrate to a first processing temperature; a first process chamber provided with the first heating device; a second heating device configured to heat the substrate to a second processing temperature utilizing microwaves, the second processing temperature being higher than the first processing temperature; a second process chamber provided with the second heating device; a substrate placement portion configured to load and unload the substrate with respect to the first process chamber and the second process chamber by placing and rotating the substrate; and a controller configured to respectively control the first heating device, the second heating device, and the substrate placement portion.

9 Claims, 13 Drawing Sheets

(51) Int. Cl.
*H01L 21/687* (2006.01)
*C23C 16/46* (2006.01)

(52) U.S. Cl.
CPC .... *H01L 21/6719* (2013.01); *H01L 21/67115* (2013.01); *H01L 21/67167* (2013.01); *H01L 21/67248* (2013.01); *H01L 21/67745* (2013.01); *H01L 21/67778* (2013.01); *H01L 21/68742* (2013.01); *H01L 21/68764* (2013.01); *H01L 21/68771* (2013.01); *H01L 21/68785* (2013.01); *H01L 21/68792* (2013.01); *H01L 21/67109* (2013.01)

(58) Field of Classification Search
CPC ....... H01L 21/637248; H01L 21/67745; H01L 21/67778; H01L 21/68742; H01L 21/68764; H01L 21/68771; H01L 21/68785; H01L 21/68792
See application file for complete search history.

(56) References Cited

U.S. PATENT DOCUMENTS

2013/0183831 A1* 7/2013 Yu .................... H01L 21/67115
                                                       438/758
2015/0179408 A1   6/2015 Shimomura et al.

FOREIGN PATENT DOCUMENTS

| JP | 06-316143 A    | 11/1996 |
| JP | 2000-133810 A  | 5/2000  |
| JP | 2001-254181 A  | 9/2001  |
| JP | 2015-122277 A  | 7/2015  |

OTHER PUBLICATIONS

International Search Report dated Apr. 26, 2016 of PCT International Application No. PCT/JP2016/055222.

* cited by examiner (a)

(b)

n: CARRIER DENSITY, T: TEMPERATURE (a)

(b)

SUBSTRATE PROCESSING APPARATUS, METHOD OF MANUFACTURING SEMICONDUCTOR DEVICE, AND NON-TRANSITORY COMPUTER-READABLE RECORDING MEDIUM

This application is a Bypass Continuation Application of PCT International Application No. PCT/JP2016/055222, filed on Feb. 23, 2016, the entire contents of which are incorporated herein by reference.

TECHNICAL FIELD

This present disclosure relates to a substrate processing apparatus, a method of manufacturing a semiconductor device, and a non-transitory computer-readable recording medium.

RELATED ART

As one of the processes of manufacturing a semiconductor device, there is, for example, an annealing process for heating a substrate in a process chamber by using a heating device and changing a composition or a crystal structure in a thin film formed on the surface of the substrate. In the recent semiconductor devices, an annealing process for a high density substrate on which a pattern having a high aspect ratio is formed is required along with miniaturization.

SUMMARY

In a conventional annealing process, it is not possible to uniformly heat a substrate on which a pattern having a high aspect ratio is formed. Thus, it has been difficult to uniformly process a substrate surface.

According to this present disclosure, there is provided a technique that enables uniform substrate processing.

According to an aspect of the present disclosure, there is provided a technique including: a first heating device configured to heat a substrate to a first processing temperature; a first process chamber provided with the first heating device; a second heating device configured to heat the substrate to a second processing temperature utilizing microwaves, the second processing temperature being higher than the first processing temperature; a second process chamber provided with the second heating device; a substrate placement portion configured to load and unload the substrate with respect to the first process chamber and the second process chamber by placing and rotating the substrate; and a controller configured to respectively control the first heating device, the second heating device, and the substrate placement portion.

DESCRIPTION OF EMBODIMENTS

First Embodiment of Present Disclosure

Hereinafter, a first embodiment of this present disclosure will be described with reference to the drawings.

(1) Configuration of Substrate Processing Apparatus

In the present embodiment, a substrate processing apparatus 100 according to this present disclosure is configured as a single-wafer type heat treatment apparatus that performs various heat treatments on wafers. In addition, in the substrate processing apparatus 100 according to this present disclosure, a front opening unified pod (FOUP) (hereinafter referred to as a pod) 110 is used as a carrier for transferring a substrate to be processed, such as a processing substrate (wafer) 200 as a product. In the following description, an X1 direction, an X2 direction, a Y1 direction, and a Y2 direction in FIG. 1 will be described as a right direction, a left direction, a forward direction, and a backward direction, respectively. Similarly, a Z1 direction and a Z2 direction in FIG. 2 will be described as an upward direction and a downward direction, respectively.

Figure 1:
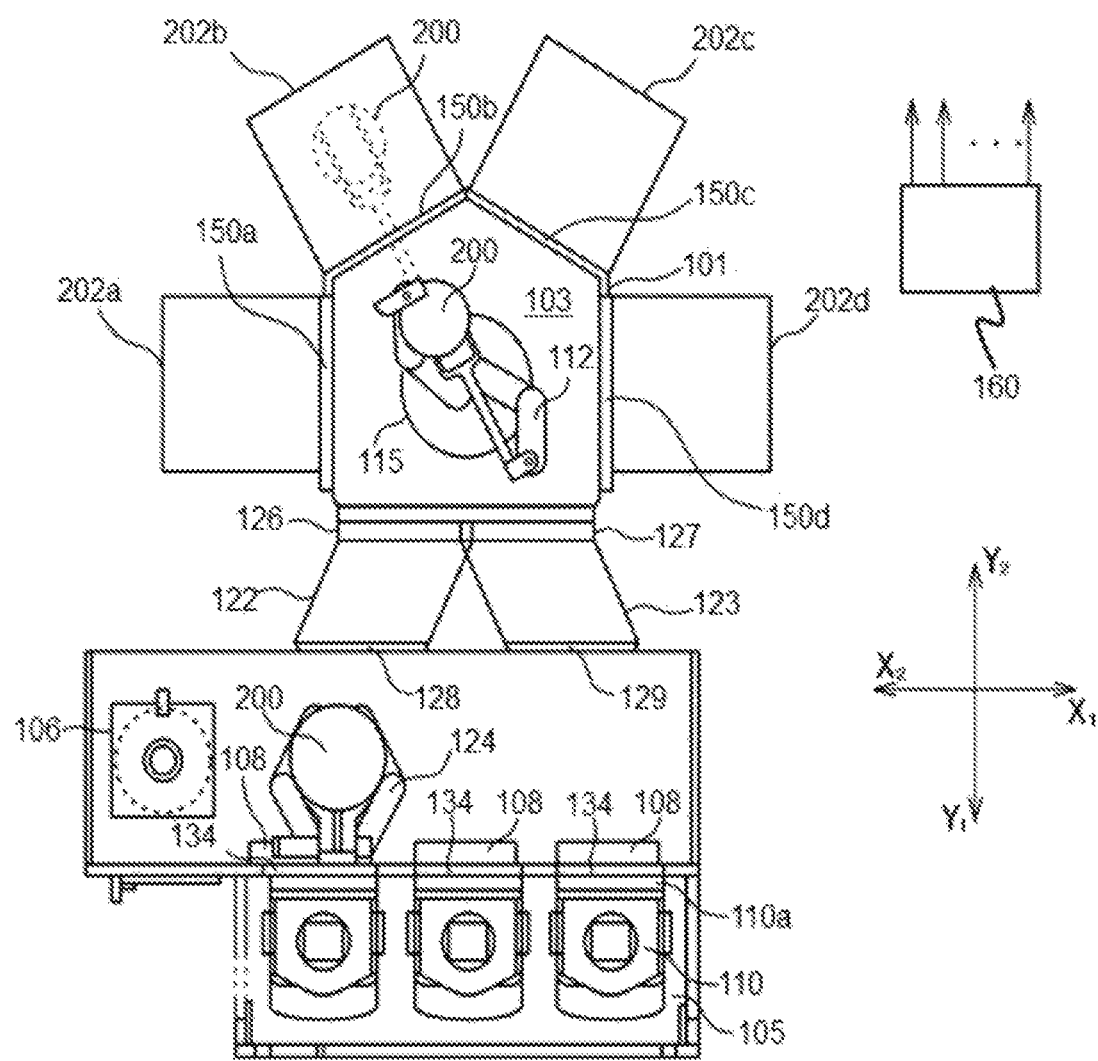
FIG. 1 is a schematic configuration diagram of a substrate processing apparatus that is suitably used in an embodiment of this present disclosure.
Figure 2:
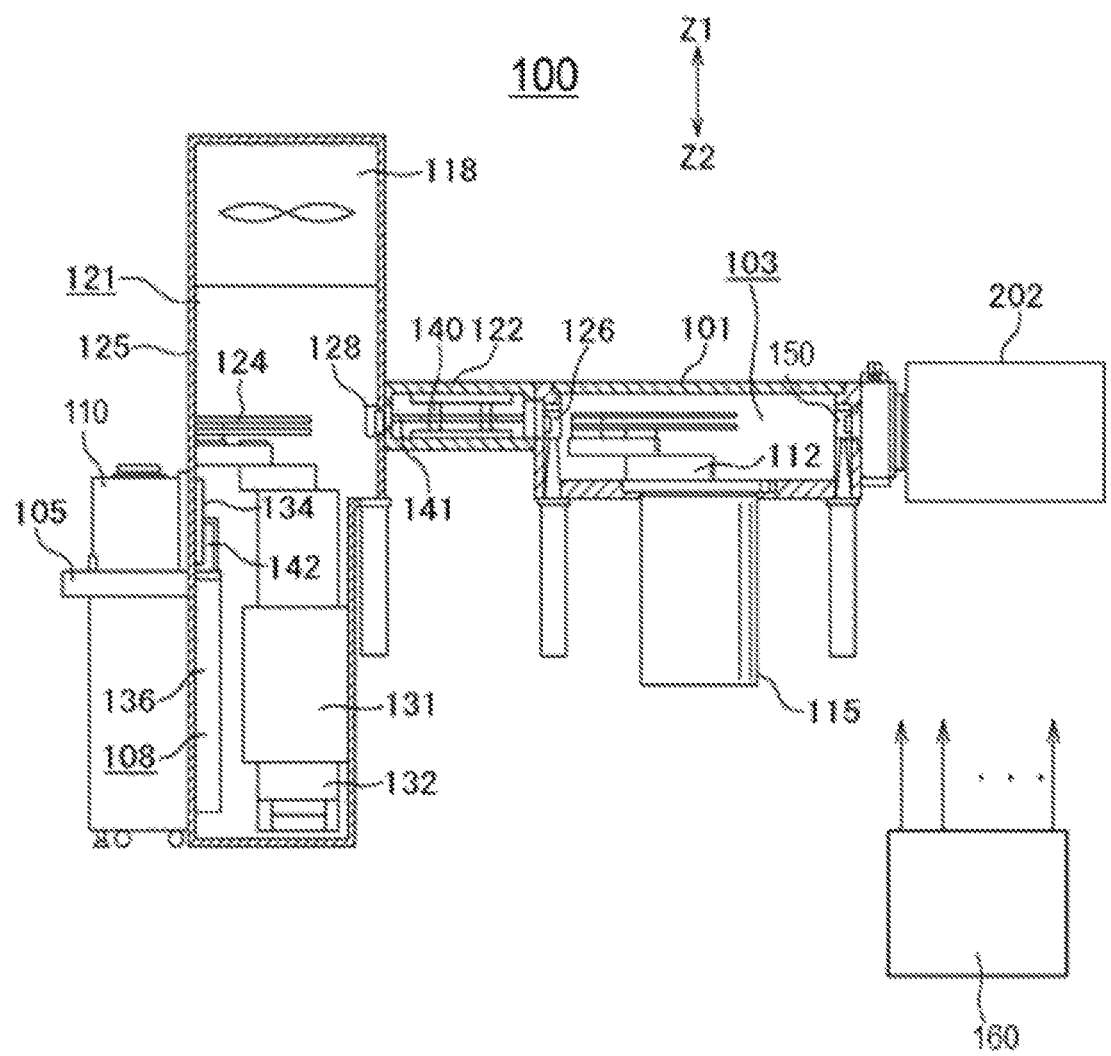
FIG. 2 is a schematic longitudinal configuration diagram of a substrate processing apparatus that is suitably used in an embodiment of this present disclosure.

As illustrated in FIG. 1 and FIG. 2, the substrate processing apparatus 100 according to the present embodiment includes a first transfer chamber 103 configured in a load lock chamber structure capable of withstanding a pressure (negative pressure) lower than an atmospheric pressure, such as a vacuum state. A housing 101 of the first transfer chamber 103 is formed in a box shape having a pentagon when seen in a plan view and having both upper and lower ends closed. In the first transfer chamber 103, a first substrate transfer device 112 is installed as a first transfer device capable of simultaneously transferring a plurality of wafers 200 under a negative pressure. The first substrate transfer device 112 may be a device capable of transferring a single wafer 200. The first substrate transfer device 112 is configured to be able to move upward and downward while maintaining the airtightness of the first transfer chamber 103 by a first substrate transfer device elevator 115 serving as an elevating mechanism.

On two sidewalls positioned on the front side of five sidewalls of the housing 101, preliminary chambers 122 and 123 capable of using both a preliminary chamber for loading and a preliminary chamber for unloading are connected via gate valves 126 and 127, respectively, and each have a structure capable of withstanding a negative pressure. Furthermore, the plurality of (for example, two) wafers 200 can be stacked on the preliminary chambers (load lock chambers) 122 and 123 by a substrate support table 140.

In the preliminary chambers 122 and 123, a partition plate (intermediate plate) 141 is installed between the wafers. When a plurality of processed substrates enter the preliminary chamber 122 or 123, the presence of the partition plate 141 can prevent thermal interference in which the temperature drop of the previously processed wafer being cooled is delayed due to the thermal effect of the next processed substrate.

A method for increasing general cooling efficiency will be described. Cooling water, chiller, or the like flows through the preliminary chambers 122 and 123 and the partition plate 141 so as to keep a wall surface temperature low and also increase the cooling efficiency regardless of in which slot the processed substrate is entered. At the negative pressure, when a distance between the substrate and the partition plate 141 is too large, the cooling efficiency due to the heat exchange is lowered. Therefore, as a method for improving the cooling efficiency, there is also a case where a driving mechanism for placing the substrate on the substrate support table 140 (pin), moving the substrate support table 140 upward and downward, and approaching the substrate to the preliminary chamber wall surface is provided.

A second transfer chamber 121 used under a substantially atmospheric pressure is connected to the front sides of the preliminary chamber 122 and the preliminary chamber 123 via gate valves 128 and 129. In the second transfer chamber 121, a second substrate transfer device 124 is installed as a second transfer device for transferring the wafers 200. The second substrate transfer device 124 is configured to be able to move upward and downward by a second substrate transfer device elevator 131 installed in the second transfer chamber 121 and is configured to be able to reciprocate in the left-right direction by a linear actuator 132.

As illustrated in FIG. 1, a notch or an orientation flat alignment device 106 can be installed on the left side of the second transfer chamber 121. In addition, as illustrated in FIG. 2, a clean portion 118 that supplies clean air is installed in an upper portion of the second transfer chamber 121.

As illustrated in FIGS. 1 and 2, a substrate loading/unloading port 134 for loading/unloading the wafers 200 with respect to the second transfer chamber 121 and a pod opener 108 are installed on the front side of the housing 125 of the second transfer chamber 121. A load port (IO stage) 105 is installed on the side opposite to the pod opener 108, with the substrate loading/unloading port 134 disposed therebetween, that is, on the outside of the housing 125. The pod opener 108 includes a closure 142 that can open and close a cap 110a of the pod 110 and can close the substrate loading/unloading port 134, and a driving mechanism 136 that drives the closure 142, and enables the wafers 200 to be loaded into and unloaded from the pod 110 by opening and closing the cap 110a of the pod 110 placed on the load port 105. In addition, the pod 110 is supplied and discharged with respect to the load port 105 by an in-process transfer device (OHT or the like) (not illustrated).

As illustrated in FIG. 1, on four sidewalls positioned on the rear side (back side) of the five sidewalls of the housing 101 of the first transfer chamber 103, a first process chamber 202a, a second process chamber 202b, a third process chamber 202c, and a fourth process chamber 202d, which perform desired processing on the substrate, are adjacent and connected via gate valves 150a, 150b, 150c, and 150d, respectively. That is, the first transfer chamber 103 is provided adjacent to each of the process chambers 202a, 202b, 202c, and 202d. The process chambers 202a, 202b, 202c, and 202d as illustrated in FIG. 2 are collectively referred to as the process chamber 202, and the gate valves 150a, 150b, 150c, and 150d are collectively referred to as the gate valve 150.

(Process Chamber)

Figure 3:
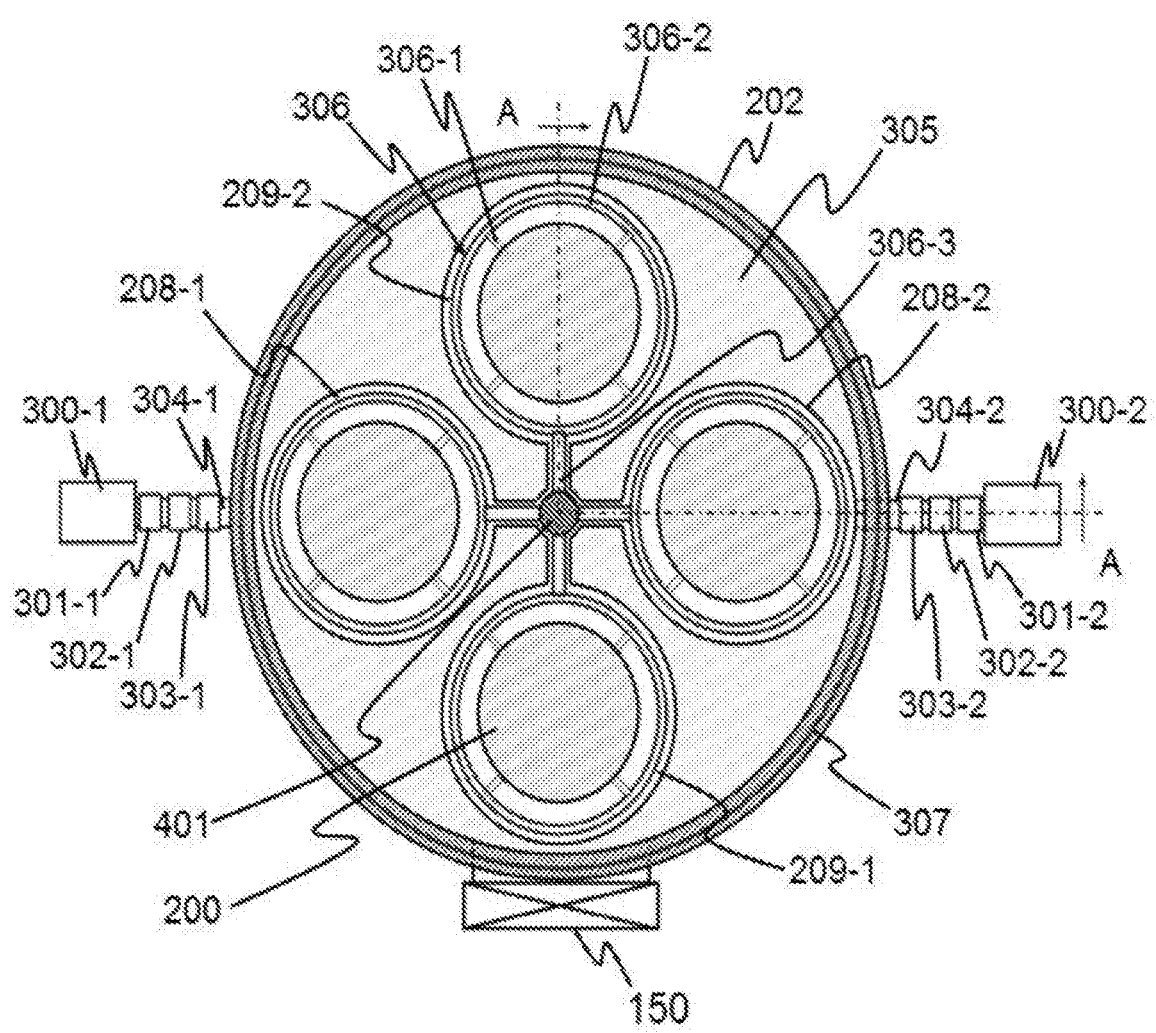
FIG. 3 is a schematic cross-sectional configuration diagram of a single-wafer type process furnace of a substrate processing apparatus that is suitably used in a first embodiment of this present disclosure.
Figure 4:
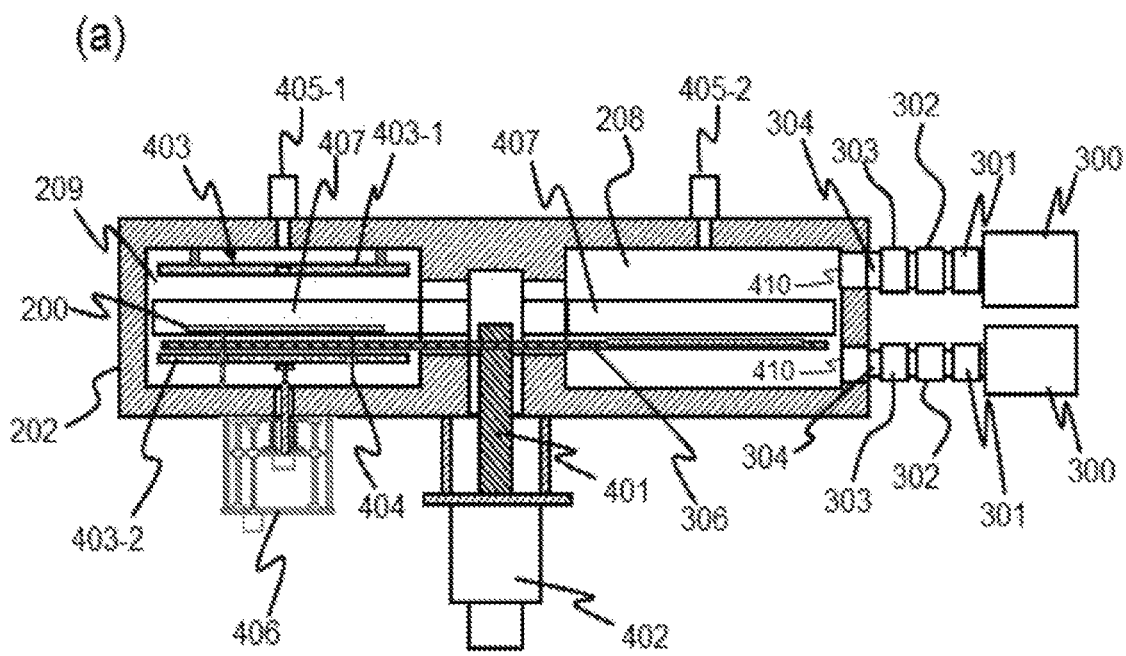
FIG. 4(a) is a schematic configuration diagram illustrating a cross-section A-A in FIG. 3 and is a diagram illustrating a case where substrate processing is performed in a preheating chamber.
FIG. 4(b) is a schematic configuration diagram illustrating a cross-section A-A in FIG. 3 and is a diagram illustrating a case where substrate processing is performed in a microwave heating chamber.
Figure 4:
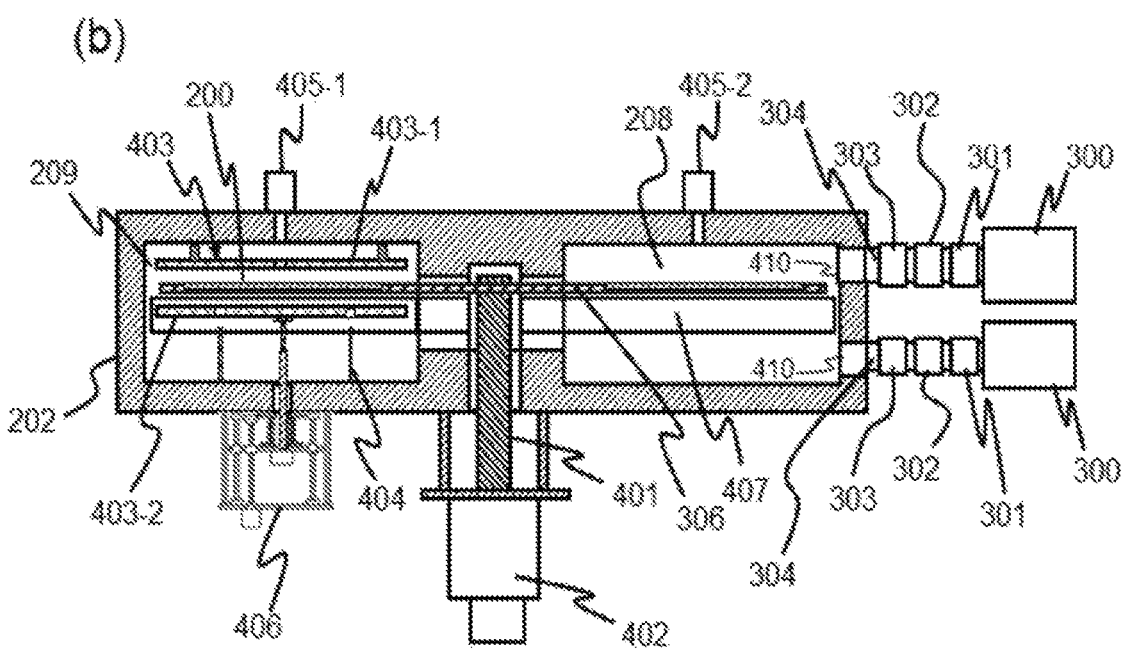

As illustrated in FIG. 3 and FIGS. 4(a) and 4(b), the process chamber 202 is provided with a reaction container 203 that is a cylindrical airtight container. The reaction container 203 is provided with an upper container 203-1 and a lower container 203-2 and is made of, for example, aluminum. In addition, the upper container 203-1 and the lower container 203-2 are airtightly sealed by an annular sealing member 307. In the reaction container 203, as the processing space of the wafer 200, there are provided two types of heating chambers, that is, microwave heating chambers (microwave process chambers) 208-1 and 208-2 that heat the wafer 200 by a microwave oscillator described later, and preheating chambers (preheating process chambers) 209-1 and 209-2 that preheat the wafer 200 by heating devices (heaters) other than microwaves, such as resistance heating heaters, and unless otherwise specified, the microwave heating chambers 208-1 and 208-2 and the preheating chambers 209-1 and 209-2 will be referred to as the microwave heating chamber 208 and the preheating chamber 209, respectively.

The microwave heating chamber 208 and the preheating chamber 209 are partitioned by a process chamber wall 305, and a tray (also referred to as a susceptor, a substrate support portion, a substrate placement portion, or a substrate holding portion) 306 is disposed as a device having both a role of a substrate rotating device that rotates and moves the wafer 200 between the microwave heating chamber 208 and the preheating chamber 209 and a role of a substrate placement portion during substrate processing. The tray 306 includes a wafer support pin (first wafer support portion) 306-1 serving as a wafer support portion that supports the wafer, a ring portion 306-2 connected to the wafer support pin 306-1 and having a diameter larger than the outer diameter of the wafer 200, and an arm 306-3 connected to the ring portion 306-2 and bonding a plurality of ring portions. The tray 306 is connected to a rotational shaft 401 positioned at the center of the tray 306. A rotation/elevation driving portion 402 connected to the rotational shaft 401 rotates or moves upward and downward such that the tray 306 rotates or moves upward and downward, and the wafer 200 is heated by the preheating chamber 209 and the microwave heating chamber 208 and a predetermined process is performed thereon.

The tray 306 is preferably made of a member (microwave transmitting member, electromagnetic wave transmitting member) such as quartz that transmits microwaves. In order to avoid that the wafer 200 is not uniformly heated by the tray 306 affecting the microwave, the support pin 306-1 and the ring portion 306-2, which are wafer support portions, are preferably configured to have the minimum necessary strength, such that the surface area is made small. In addition, the support pin 306-1 preferably has a structure or material with a small heat capacity and a small thermal conductivity. With such a configuration of the tray 306, it is possible to prevent the tray 306 from being heated and heating the wafer 200 by heat transfer from the tray 306, and selective heating for selectively heating the film formed on the wafer surface can be performed without heating the wafer 200.

As illustrated in FIG. 4(a), in the preheating chamber 209, an upper heater 403-1 provided on a ceiling portion of the preheating chamber 209 and a lower heater 403-2 provided below the tray 306 and lifted and lowered by a heater elevating unit (heater elevator) 406 are provided as a preheating device 403 for preliminarily heating the wafers 200 transferred to the process chamber 202. In addition, the lower heater 403-2 is provided with a through-hole through which a wafer support pin (second wafer support portion) 404 that supports the wafer passes.

In addition, in the microwave heating chamber 208, microwave oscillators 300-1 and 300-2 to be described later are connected to the reaction container 203 via a waveguide 304-2, together with an isolator 301-2, a directional coupler 302-2, and a matcher 303-2. Unless otherwise specified, the microwave oscillator, the isolator, the directional coupler, the matcher, and the waveguide are referred to as a microwave oscillator 300, an isolator 301, a directional coupler 302, a matcher 303, and a waveguide 304, respectively.

(Microwave Supply Portion)

An electromagnetic wave introduction port 410 is installed on a sidewall of the microwave heating chamber 208. One end of the waveguide 304 for supplying an electromagnetic wave to the microwave heating chamber 208 is connected to the electromagnetic wave introduction port 410. The microwave oscillator (electromagnetic wave source, microwave power supply) 300 serving as a heating source that supplies an electromagnetic wave to the inside of the microwave heating chamber and performs heating, the isolator 301 for absorbing the reflected wave in the middle of the waveguide such that the microwave supplied to the waveguide 304 does not return to the microwave power source by being reflected on the downstream side, the directional coupler 302 for measuring an electric signal proportional to the power of one of a traveling wave and a reflected wave, and the matcher 303 for matching the impedances of the microwave oscillator side and the load side are sequentially connected to the other end of the waveguide 304. As the microwave oscillator 300, a magnetron, a klystron, or the like is used, and an electromagnetic wave such as a microwave is supplied to the waveguide 304 via the isolator 301, the directional coupler 302, and the matcher 303. A frequency of the electromagnetic wave generated by the microwave oscillator 300 is preferably controlled so as to be in a frequency range of 13.56 MHz to 24.125 GHz. More preferably, it is controlled to have a frequency of 2.45 GHz or 5.8 GHz.

In addition, in the present embodiment, two microwave oscillators 300 are described as being disposed on the side surface of the microwave heating chamber 208 in multiple stages in a vertical direction, but this present disclosure is not limited thereto, and at least one microwave oscillator may be provided.

Mainly, the microwave oscillator 300 and the waveguide 304 constitute a microwave heating device as an electromagnetic wave supply portion (electromagnetic wave supply device, microwave supply portion, microwave supply device). Any one or all of the isolator 301, the directional coupler 302, and the matcher 303 maybe included as the microwave heating device.

A controller 160 to be described later is connected to the microwave oscillators 300. Temperature sensors 405-1 and 405-2 that measure the temperatures of the wafers 200 accommodated in the microwave heating chamber 208 and the preheating chamber 209 are connected to the controller 160. The temperature sensors 405-1 and 405-2 measure the temperatures of the wafers 200, transmit the measured temperatures to the controller 160, control the outputs of the preheating device 403 and the microwave oscillator 300 by the controller 160 controls, and control the heating of the wafers 200.

Each of the microwave oscillators 300-1 and 300-2 is controlled by the same control signal transmitted from the controller 160. However, this present disclosure is not limited thereto, and the microwave oscillators 300-1 and 300-2 may be individually controlled by transmitting individual control signals from the controller 160 to each of the microwave oscillators 300-1 and 300-2. Furthermore, in each of the microwave oscillators 300-1 and 300-2, the upper and lower sides thereof maybe controlled by the same control signal or individual control signals. In the case of controlling the microwave oscillator 300 by the same control signal transmitted from the controller 160 as described above, it becomes a single control, but it is possible to simplify the control. In the case of controlling the microwave oscillator 300 by individual control signals, it becomes a complicated control, but it is possible to perform detailed control for each heating chamber.

(Exhaust Portion)

Figure 5:
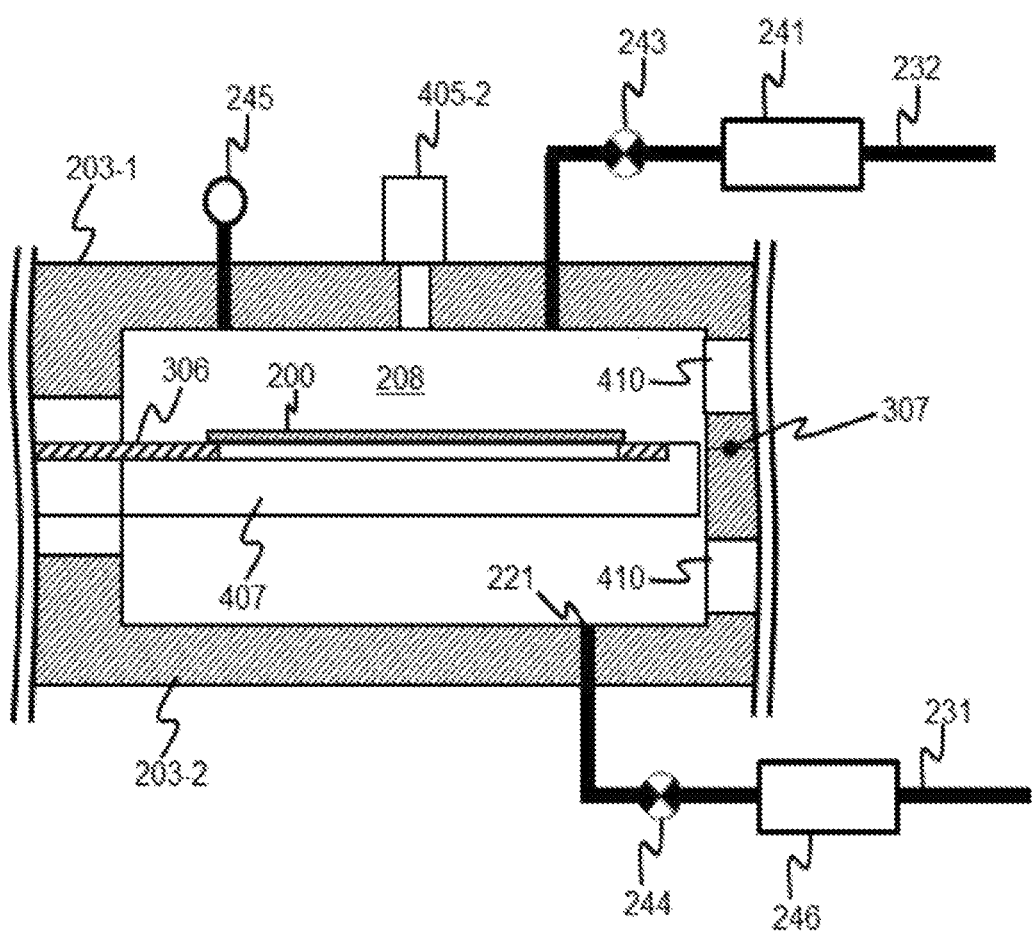
FIG. 5 is a schematic enlarged configuration diagram of the microwave heating chamber in FIG. 4(b).

An exhaust portion for exhausting the atmosphere in the microwave heating chamber 208 is provided below the microwave heating chamber 208 and below the tray 306. As illustrated in FIG. 5, an exhaust port 221 is provided in the exhaust portion. An exhaust pipe 231 is connected to the exhaust port 221. In the exhaust pipe 231, a pressure regulator 244 and a vacuum pump 246 are sequentially connected in series. The pressure regulator 244 may be, for example, an APC valve for controlling a degree of valve opening according to a pressure in the microwave heating chamber 208.

The pressure regulator 244 is not limited to the APC valve as long as it can receive pressure information in the process chamber 201 (a feedback signal from a pressure sensor 245 to be described later) and adjust an exhaust amount, and a general on-off valve and a general pressure regulation valve may be used in combination.

Mainly, an exhaust portion (also referred to as an exhaust system or an exhaust line) is configured by the exhaust port 221, a reduced pressure system exhaust pipe 231, and the pressure regulator 244. An exhaust path may be provided so as to surround the process chamber 201 and may be configured such that gas can be exhausted from the entire periphery of the wafer 200. In addition, the vacuum pump 246 may be added to the configuration of the exhaust portion.

(Gas Supply Portion)

On the ceiling surface of the microwave heating chamber 208, a gas supply pipe 232 for supplying process gases for a variety of substrate processing, such as an inert gas, a precursor gas, and a reactant gas to the microwave heating chamber 208 is provided.

A mass flow controller (MFC) 241 that is a flow rate controller (flow rate control unit) and a valve 243 that is an on-off valve are provided in the gas supply pipe 232 in this order from the upstream. For example, a nitrogen (N2) gas source as an inert gas is connected to the upstream side of the gas supply pipe 232 and supplied to the process chamber 201 through the MFC 241 and the valve 243. In the case of using a plurality of types of gases at the time of substrate processing, a gas supply pipe provided with an MFC serving as a flow rate controller and a valve serving as an on-off valve may be sequentially connected from the upstream direction to the gas supply pipe 232 at the downstream side of the valve 243.

In a case where the inert gas is supplied from the gas supply pipe 232, an inert gas supply system is mainly configured by the gas supply pipe 232, the MFC 241, and the valve 243. In addition to the $N_2$ gas, a rare gas such as an Ar gas, a He gas, a Ne gas, or a Xe gas can also be used as the inert gas.

(Control Device)

Figure 6:
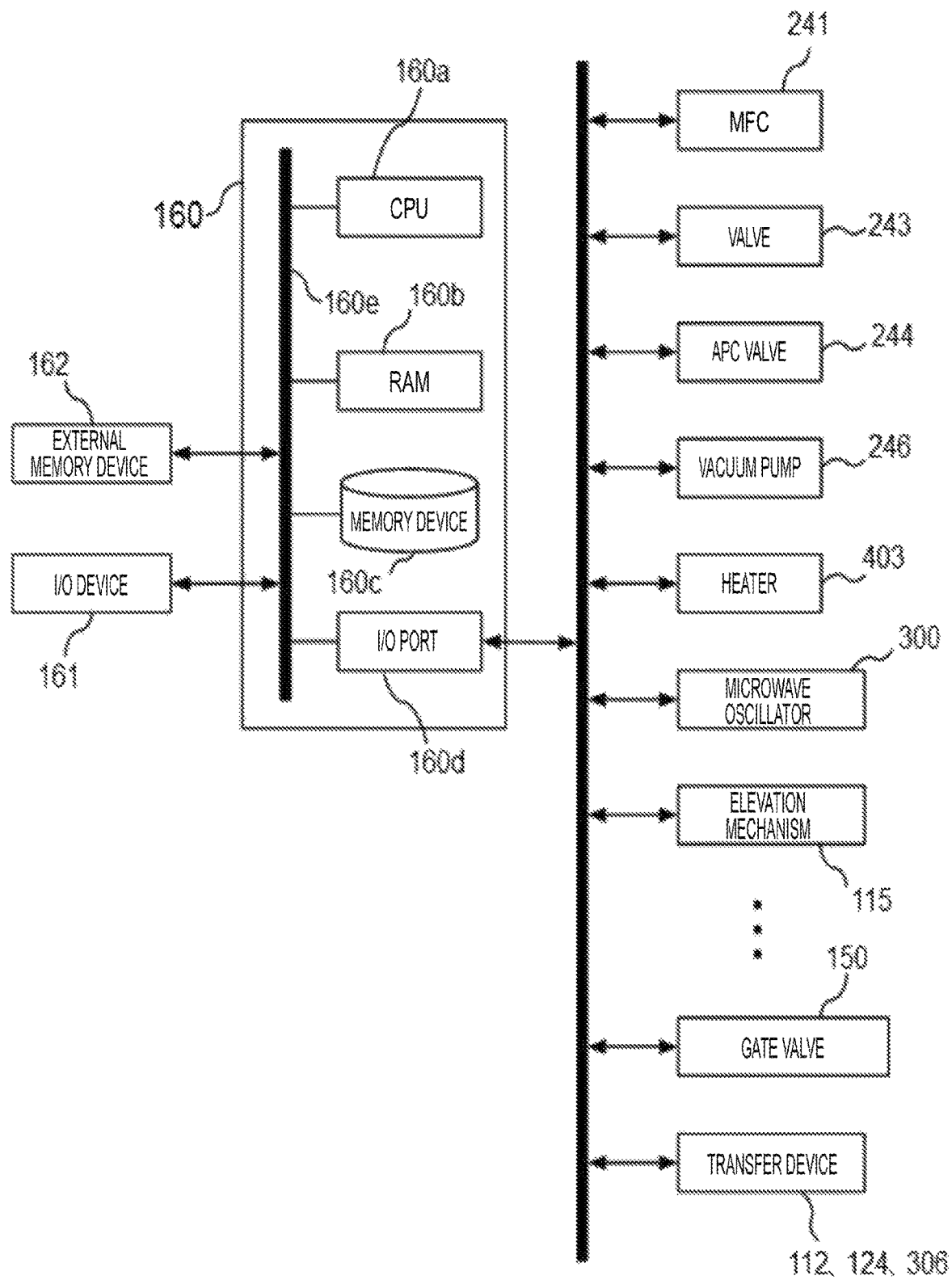
FIG. 6 is a schematic configuration diagram of a controller of a substrate processing apparatus that is suitably used in this present disclosure.

As illustrated in FIG. 6, the controller 160 that is a control unit (control device) is configured by a computer that includes a central processing unit (CPU) 160a, a random access memory (RAM) 160b, a memory device 160c, and an input/output (I/O) port 160d. The RAM 160b, the memory device 160c, and the I/O port 160d are configured to exchange data with the CPU 160a through an internal bus 160e. An I/O device 161, which is configured as, for example, a touch panel or the like, is connected to the controller 160.

The memory device 160c is configured by, for example, a flash memory, a hard disk drive (HDD), or the like. In the memory device 160c, a control program for controlling an operation of a substrate processing apparatus or a process recipe including procedures or conditions of a reforming process to be described later is stored to be readable. The process recipe is a combination of procedures of a substrate processing process described later so as to obtain a desired result when the procedures are performed by the controller 160, and functions as a program. Hereinafter, the process recipe, the control program, and the like will be simply and collectively referred to as a program. In addition, the process recipe is simply referred to as a recipe. When the term "program" is used in the present specification, it may be understood as including a recipe alone, a control program alone, or both of the recipe and the control program. The RAM 160b is configured as a memory area (work area) in which a program or data read by the CPU 160a is temporarily retained.

The I/O port 160d is connected to the MFC 241 that controls the flow rate of the gas supplied to the microwave heating chamber 208 and the preheating chamber 209, the valve 243 that opens and closes the gas supply pipe, the pressure sensor 245, the APC valve 244, the vacuum pump 246, the temperature sensors 405-1 and 405-2, the driving mechanism 267, the microwave oscillator 300, and the like.

The CPU 160a is configured to read and execute the control program from the memory device 160c and read the recipe from the memory device 160c according to an input of an operation command from the I/O device 161, or the like. The CPU 160a is configured to control the operation of adjusting the flow rates of various gases by the MFC 241, the operation of opening and closing the valve 243, the operation of opening and closing the APC valve 244, the operation of adjusting the pressure by the APC valve 244 based on the pressure sensor 245, the start and stop of the vacuum pump 246, the control of temperature of the preheating device 403 based on the temperature sensor 405-1, the operation of adjusting the output of the microwave oscillator 300 based on the temperature sensor 405-2, the operation of adjusting the rotation and the rotating speed of the tray 306 by the rotation/elevation driving portion 402, the elevating operation, or the like according to the contents of the read recipe.

The controller 160 can be configured by installing, on a computer, the program stored in an external memory device (for example, a magnetic tape, a magnetic disk such as a flexible disk or a hard disk, an optical disk such as a CD or a DVD, a magneto-optical disk such as an MO, or a semiconductor memory such as a USB or a memory card) 162. The memory device 160c or the external memory device 162 is configured as a non-transitory computer-readable recording medium. Hereinafter, the memory device 160c and the external memory device 162 may be simply and collectively referred to as a recording medium. When the term "recording medium" is used in the present specification, it may be understood as including the memory device 160c alone, the external memory device 162 alone, or both of the memory device 160c and the external memory device 162. The provision of the program to the computer may be performed by using a communication unit such as the Internet or dedicated lines, without using the external memory device 162.

(2) Substrate Processing Process

Figure 7:
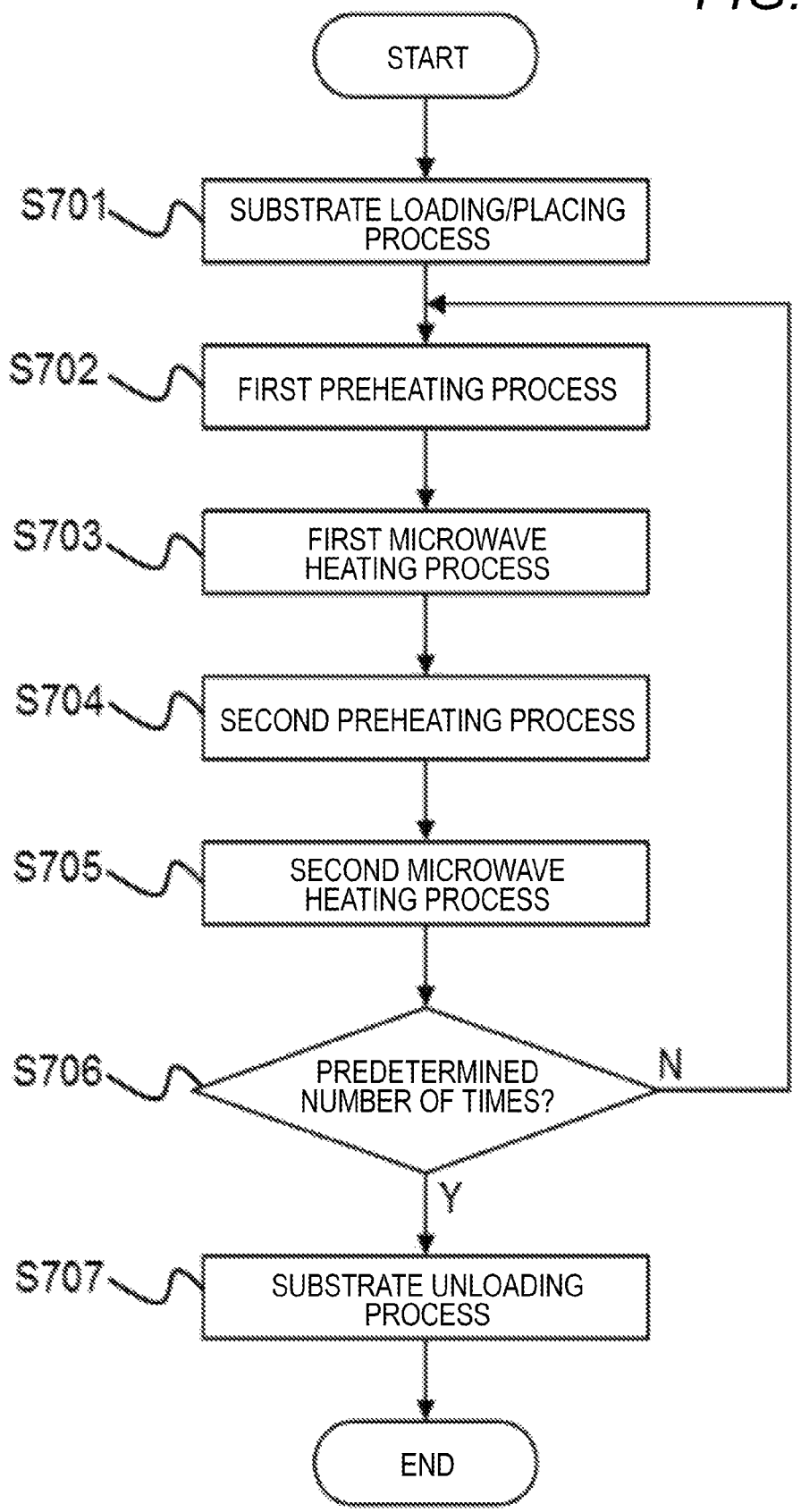
FIG. 7 is a diagram illustrating a flow of a substrate processing process according to this present disclosure.
Figure 8:
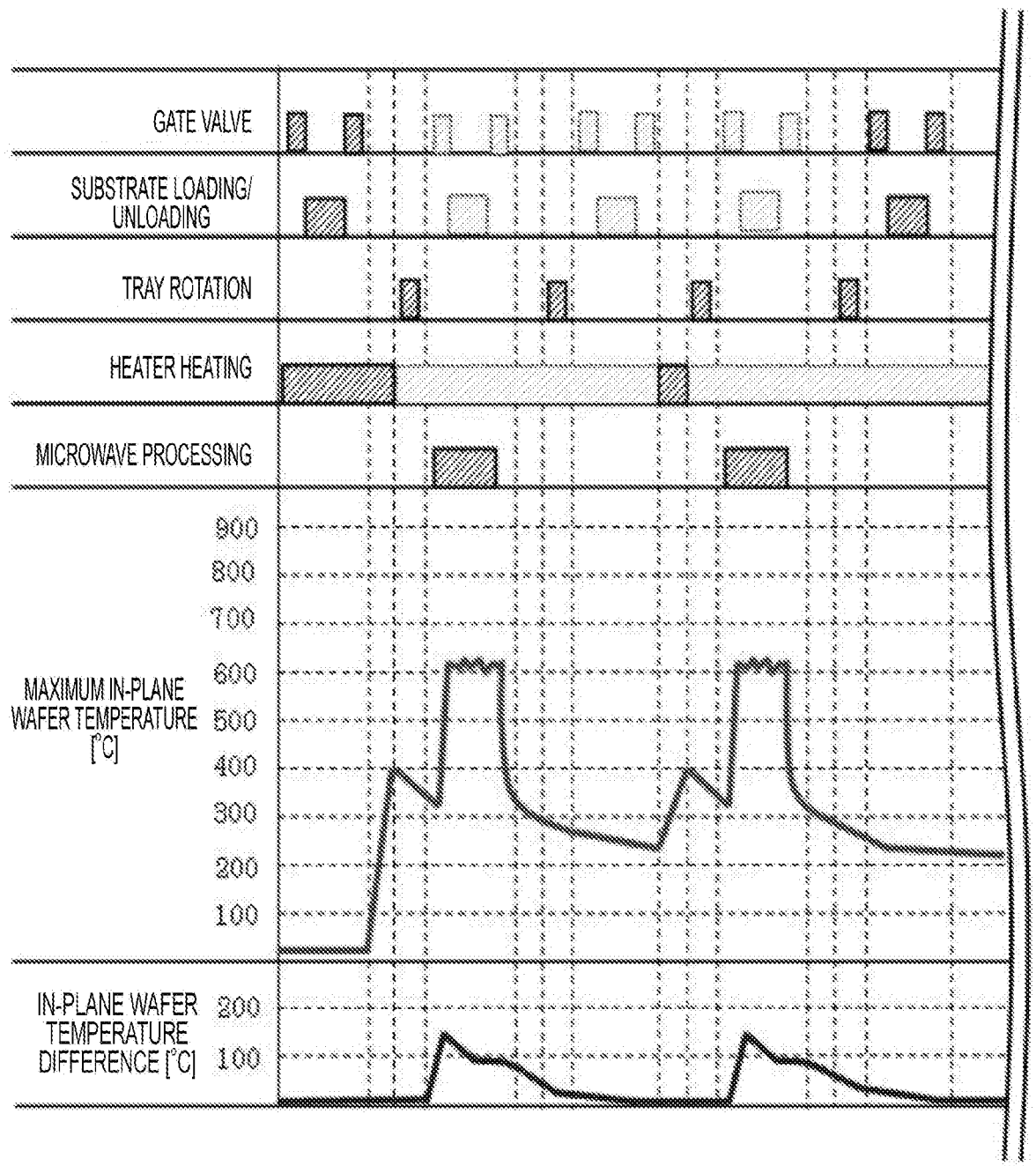
FIG. 8 is a diagram illustrating a substrate processing sequence in an arbitrary substrate processed in the first embodiment of this present disclosure.

Next, as one of the processes of manufacturing the semiconductor device by using the process furnace of the above-described substrate processing apparatus 100, an example of a method of reforming (crystallizing) an amorphous silicon film as a silicon-containing film formed on a wafer will be described along processing flows illustrated in FIG. 7 and FIG. 8. In the following description, the operations of the respective components constituting the substrate processing apparatus 100 are controlled by the controller 160.

When the term "wafer" is used in the present specification, it may be understood as meaning "a wafer itself (product wafer)", "a laminate (aggregate) of a wafer and a predetermined layer or film formed on a surface thereof", that is, a wafer including a predetermined layer or film formed on a surface thereof, or "a target substrate (target wafer) " to be described later or "a dummy substrate (dummy wafer) " to be described later or "both of a target substrate (target wafer) and a dummy substrate (dummy wafer) ". In addition, when the term "a surface of a wafer" is used in the present specification, it maybe understood as meaning "a surface (exposed surface) of a wafer itself" by using the definition of the "wafer" or "a surface of a predetermined layer or film formed on a wafer, that is, an uppermost surface of a wafer as a laminate".

Thus, when the term "a predetermined gas is supplied to a wafer" is used in the present specification, it maybe understood as meaning that "a predetermined gas is supplied to a surface (exposed surface) of a wafer itself" by using the definition of the "wafer" or that "a predetermined gas is supplied to a layer or film formed on a wafer, that is, an uppermost surface of a wafer as a laminate". In addition, when the term "a predetermined layer (or film) is formed on a wafer" is used in the present specification, it may be understood as meaning that "a predetermined layer (or film) is formed on a surface (exposed surface) of a wafer itself" or that "a predetermined layer (or film) is formed on a layer or film formed on a wafer, that is, an uppermost surface of a wafer as a laminate".

In addition, the case where the term "substrate" is used in the present specification is the same as the case where the term "wafer" is used.

(Substrate Loading/Placing Process (S701))

As illustrated in FIG. 2, when the pod 110 is placed on the load port 105, the cap 110a is opened by the pod opener 108, and a predetermined number of wafers 200 are loaded into the preliminary chamber 122 or 123 by the second substrate transfer device 124. The wafer 200 loaded into the preliminary chamber 122 or 123 is held by the first transfer device, is loaded into the predetermined process chamber 202, more accurately, the preheating chamber 209-1 under the control of the controller 160, and placed on the wafer support pin 404 waiting in the preheating chamber 209-1 (S701). At this time, in the microwave heating chamber 208 and the preheating chamber 209, a $N_2$ gas as an inert gas is supplied from the gas supply system formed by the gas supply pipe 232, the MFC 241, and the valve 243, the atmospheres in the microwave heating chamber 208 and the preheating chamber 209 are replaced, and the oxygen concentrations in the microwave heating chamber 208 and the preheating chamber 209 are controlled to a predetermined value or less, for example, 10 ppm or less. In addition, the gas supply portion and the exhaust portion are controlled such that the pressures in the microwave heating chamber 208 and the preheating chamber 209 become desired pressures such as atmospheric pressure, slightly pressurized pressure (to 1.01 [KgF/cm2]), or reduced pressure (≤1 [Pa]). Preferably, by making the pressure in the microwave heating chamber 208 and the preheating chamber 209 be slightly pressurized pressure or atmospheric pressure, it is possible to prevent the wafer temperature from lowering when transferring the wafer 200 between the microwave heating chamber 208 and the preheating chamber 209. In addition, plasma generation by microwaves can be avoided by making the pressure appropriate. For example, abnormal discharge caused by plasma can be suppressed by performing annealing at 0.01 MPa or more or 1 Pa or less.

(Substrate Processing Process)

(First Preheating Process (S702))

When the wafer 200 is placed on the wafer support pin 404 in the preheating chamber 209-1, the tray 306 moves upward, the wafer 200 is placed on the wafer support pin 306-1, and the wafer 200 is disposed at a position where preheating can be performed by the heater 403. When the tray 306 moves upward, the lower heater 403-2 moves upward to a predetermined position by the heater elevating unit 406, and the wafer 200 is sandwiched by the upper heater 403-1 and the lower heater 403-2. When the wafer 200 and the lower heater 403-2 are arranged at predetermined positions, the heater 403 is heated to a predetermined temperature (first preheating temperature) according to a control signal from the controller 160, and the wafer 200 is preliminarily heated (S702). During the first preheating, the heater 403 is controlled by measuring the surface temperature of the wafer 200 with the temperature sensor 405-1.

By preliminarily heating the wafer 200 in this manner, it is possible to reduce a temperature difference within the surface of the wafer 200 due to uneven heating caused by a microwave heating process to be described later, and it is possible to suppress the warpage and crack of the wafer 200. The first preheating temperature is preferably controlled to be 100° C. to 450° C., and particularly preferably 300° C. to 400° C.

(First Microwave Heating Process (S703))

When a predetermined times elapses or when the wafer 200 reaches a predetermined temperature, the preheating process is completed and the lower heater 403-2 and the tray 306 move downward. When the tray 306 moves downward to a predetermined position, the rotational shaft 401 rotates via the rotation/elevation driving portion 402, and the tray 306 rotates clockwise by 90°. As the tray 306 rotates, the wafer 200 is loaded into the microwave heating chamber 208-1 through a slit 407 provided in the preheating chamber 209-1.

The wafer 200 loaded into the microwave heating chamber 208-1 moves upward to a predetermined height by the tray 306. Along with an temperature increase to a predetermined temperature (first reforming processing temperature) by the microwaves generated by the microwave oscillator 300-1, the first reforming processing temperature is maintained for a predetermined time after reaching the first reforming processing temperature, and an amorphous silicon film formed on the surface of the wafer 200 is crystallized (reformed) (S703).

The temperature of the wafer 200 is controlled by measuring the surface temperature of the wafer 200 with the temperature sensor 405-2. The microwave oscillator 300 supplies microwaves from the electromagnetic wave introduction port 410 to the process chamber 201 through the waveguide 304. Since the microwaves supplied to the process chamber 201 are incident on the wafer 200 and efficiently absorbed, it is possible to extremely effectively increase the temperature of the wafer 200. The microwaves generated by the microwave oscillator 300 are controlled so as to raise the temperature of the wafer 200 to a temperature range of 300° C. to 700° C., and preferably 500° C. to 600° C.

In addition, the length of time for maintaining the reforming processing temperature varies depending on a film type to be reformed, but there are cases where microwaves are irradiated continuously or irradiated in a pulse shape. When maintaining the temperature of the wafer 200 within a certain range, microwave power is controlled to continuously irradiate the microwave, and in a case where it is desired to make the electric field of the microwave applied to the wafer 200 larger than the case of continuous irradiation while maintaining the required temperature, the microwave power is supplied in a pulse shape.

(Second Preheating Process (S704))

When the surface of the wafer 200 is heated and reformed by microwaves for a predetermined time, the first microwave heating process is completed and the tray 306 moves downward. When the tray 306 moves downward to a predetermined position, the rotational shaft 401 rotates via the rotation/elevation driving portion 402, and the tray 306 rotates clockwise by 90°. As the tray 306 rotates, the wafer 200 is loaded into the preheating chamber 209-2 through the slit 407 provided in the microwave heating chamber 208-1.

Similarly to the first preheating process (S702), the tray 306 and the lower heater 403-2 move upward to a predetermined position, and the wafer 200 loaded into the preheating chamber 209-2 is sandwiched by the upper heater 403-1 and the lower heater 403-2. When the wafer 200 and the lower heater 403-2 are arranged at predetermined positions, the heater 403 is heated to a predetermined temperature (second preheating temperature) according to a control signal from the controller 160, and the wafer 200 is preliminarily heated (S704). During the second preheating, the heater 403 is controlled by measuring the surface temperature of the wafer 200 with the temperature sensor 405-1.

Similarly to the first preheating temperature, the second preheating temperature is preferably controlled to be 100° C. to 450° C., and particularly preferably 300° C. to 400° C.

(Second Microwave Heating Process (S705))

When a predetermined times elapses or when the wafer 200 reaches a predetermined temperature, the second preheating process is completed and the lower heater 403-2 and the tray 306 move downward similarly to the case where the first preheating process is completed. After that, as the tray 306 rotates clockwise by 90°, the wafer 200 is loaded into the microwave heating chamber 208-2 through the slit 407.

Similarly to the first microwave heating process (S703), the wafer 200 loaded into the microwave heating chamber 208-2 moves upward to a predetermined height by the tray 306 and the temperature of the wafer 200 is raised to a predetermined temperature (second reforming processing temperature) by the microwaves generated by the microwave oscillator 300-1. After reaching the second reforming processing temperature, the second reforming processing temperature is maintained for a predetermined time to reform the amorphous silicon film formed on the surface of the wafer 200 (S705).

As the method of heating the wafer 200 in this manner, the preheating by the heater 403 and the microwave heating by the microwave oscillator 300 are alternately performed. In this case, even if the microwave standing wave is formed in the heating chamber 208 and a region (microwave concentration region, hot spot) concentrated and heated on the wafer surface is formed, a temperature difference at the time of temperature rise from the region other than the region where hot spot occurred also becomes small. The state of processing inside the wafer 200 is made uniform by reducing the temperature difference. In addition, since it is heated in the preheating chamber, it is possible to prevent the temperature of the wafer 200 from excessively lowering. Furthermore, by providing a period during which heat transfer occurs within the plane of the wafer 200, it is possible to suppress occurrence of deformation such as crack, warpage, or distortion, in which the microwave irradiation region is concentrated and heated and the in-plane temperature of the wafer 200 becomes non-uniform.

As described above, the amorphous silicon film formed on the surface of the wafer 200 is reformed (crystallized) into a polysilicon film by heating the wafer 200. That is, the wafer 200 can be uniformly reformed.

(Determination (S706))

When the second microwave heating process S705 is completed, the controller 160 determines whether the cycle, which includes the first preheating process S702, the first microwave heating process S703, the second preheating process S704, and the second microwave heating process S705, is performed as one cycle a predetermined number of times.

In this manner, the process from the first preheating process S702 to the determination S706 can be referred to as a reforming process or a substrate processing process. The process from the first preheating process S702 to the second microwave heating process S705 may be referred to as a reforming process or a substrate processing process.

(Substrate Unloading Process (S707))

The wafer 200 is unloaded to the first transfer chamber 103. After that, the wafer 200 is transferred to the preliminary chamber 122 or 123 that is adjacent to the first transfer chamber 103.

By repeating the above operation, the wafer 200 is reformed.

Figure 9:
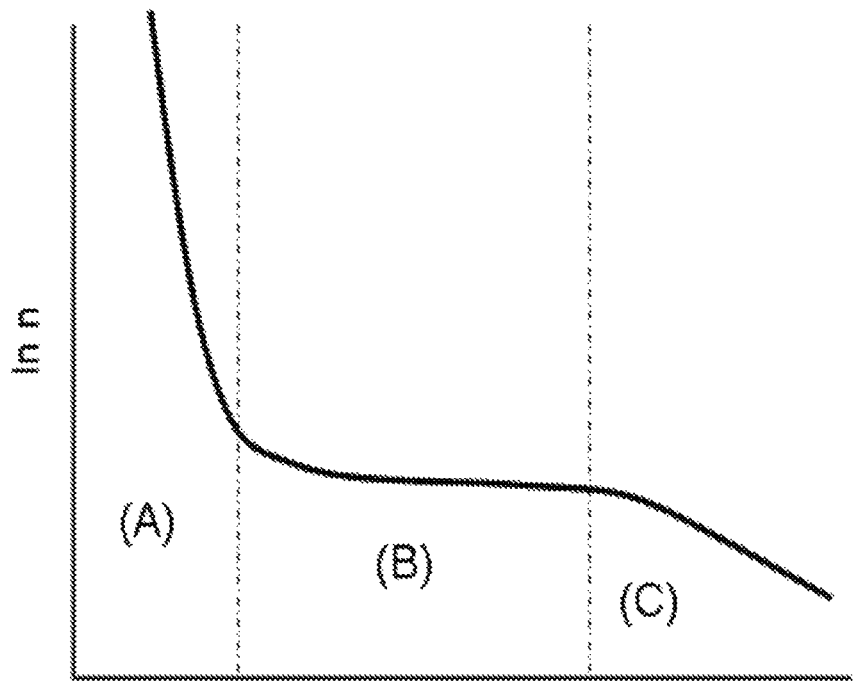
FIG. 9 is a diagram illustrating a relationship between a carrier density and a temperature of a substrate in this present disclosure.

As illustrated in FIG. 9, in the case of showing an example of the temperature dependence of the carrier density of the wafer 200, in which a vertical axis represents the carrier density (proportional to the conductivity) and a horizontal axis represents the temperature, it can be divided into a region (A), a region (B), and a region (C) according to the temperature. For example, the temperature at which the regions (A) and (B) are separated is 327° C., and the temperature at which the regions (B) and (C) are separated is −73° C. As is apparent from FIG. 9, the carrier densities in the regions (A) and (C) also rise greatly as the temperature rises, but the carrier density in the region (B) does not rise greatly even when the temperature rises.

Since the heat amount of the wafer 200 generated per unit time is proportional to the carrier density of the wafer 200, the amount of heat generation also changes as the carrier density changes. Therefore, in a case where microwave heating is performed in the region (A) where the change in the carrier density is large, since the rate at which the carrier density increases according to the temperature change is large, the temperature rise rate of the wafer 200 increases even if the power of the irradiated microwaves is the same. Therefore, it is preferable that the first and second microwave heating processes are performed in the region (A). In addition, the temperature rise rate of the wafer 200 is high in the region (A) as described above. Therefore, when the microwaves are locally concentrated, the temperature of the concentrated portion becomes high, and a temperature difference partially increases in the plane of the wafer 200, and the wafer 200 is deformed due to a thermal expansion difference. Therefore, process control is performed such that the first and second preheating processes are performed in the temperature range of the region (B) and the first and second microwave heating processes are performed in the region (A). In this manner, it is possible to improve the reforming processing speed of the wafer 200 while suppressing deformation of the wafer 200 by reducing the in-plane temperature difference of the wafer 200.

Since a relationship between the carrier density and the temperature as illustrated in FIG. 9 changes according to the material of the wafer 200, control is performed such that the first and second microwave heating processes and the first and second preheating processes are performed in the temperature range of the region (B) according to the material of the wafer 200. In a case where the microwave heating process is performed in the region (B), the increase in the carrier density is small, and the temperature rise rate does not increase so much. Since a temperature difference hardly occurs in the plane of the wafer 200, it is possible to simplify temperature control in microwave heating.

(4) Effects of Present Embodiment

According to the present embodiment, one or more effects to be described below are exhibited.

(a) By alternately performing the preheating process and the microwave heating process in different heating chambers as the heating method for reforming the wafer, it is possible to suppress the local heating in the wafer surface due to the occurrence of the microwave standing wave, and it is possible to suppress occurrence of deformation such as crack, warpage, or distortion in the wafer.

(b) By performing the preheating process before the microwave heating, it is possible to suppress increasing of the temperature difference within the wafer surface due to the microwave heating, and it is possible to suppress occurrence of deformation such as crack, warpage, or distortion in the wafer.

(c) By performing the preheating process after the microwave heating process, it is possible to suppress excessive decrease in the temperature of the wafer surface, and it is possible to shorten the wafer temperature rise time in the next microwave heating process.

(d) In performing the microwave heating process, by performing the process in the temperature range where the change in the carrier density is small, it is possible to suppress occurrence of the temperature difference within the wafer surface, and it is possible to suppress occurrence of deformation such as crack, warpage, or distortion in the wafer.

(5) Modification Example of First Embodiment

The substrate processing apparatus according to the present embodiment is not limited to the above-described aspect, and the following modification can be made.

Figure 10:
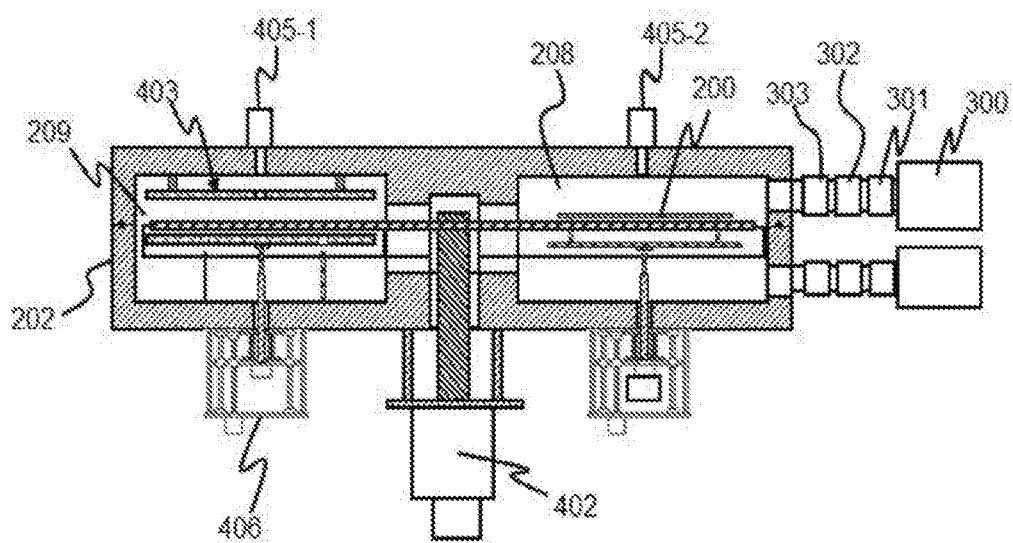
FIG. 10(a) is a diagram illustrating a modification example of the first embodiment of this present disclosure.
FIG. 10(b) is a schematic enlarged configuration diagram of a microwave heating chamber in a modification example.
Figure 10:
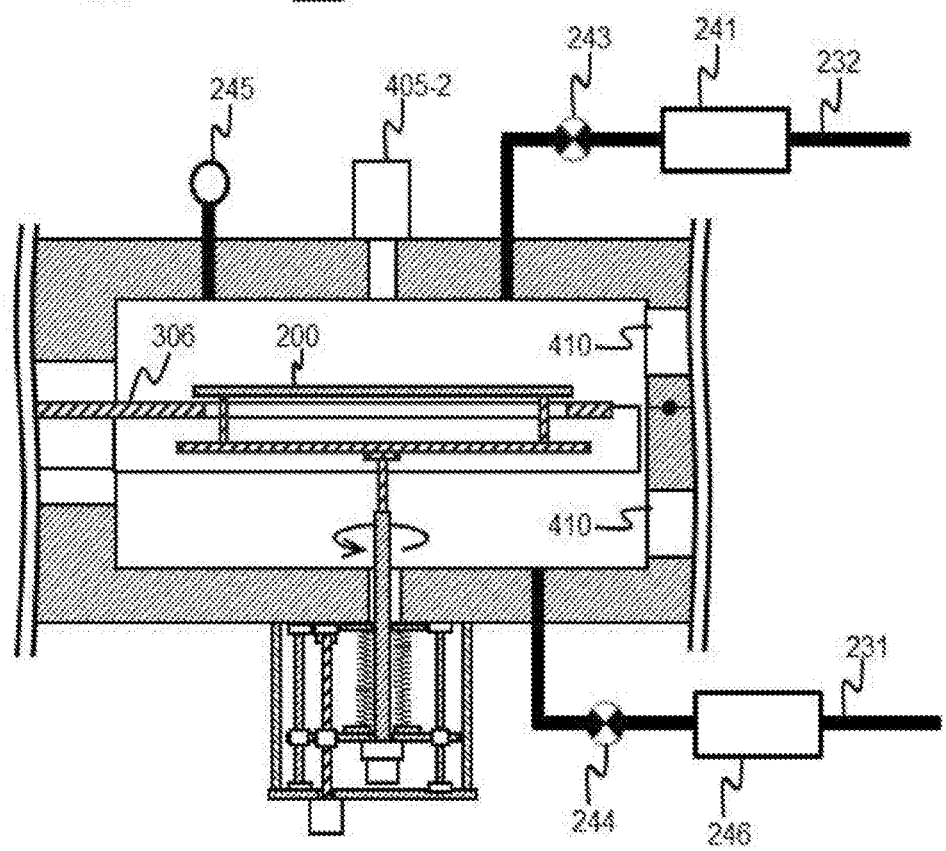

In the modification example as illustrated in FIGS. 10(a) and 10(b), a wafer rotating unit is provided in a microwave heating chamber 208, and a wafer 200 rotates in the microwave heating chamber 208 during a microwave heating process.

With such a configuration, it is possible to suppress local heating of the wafer 200 by microwaves, and it is possible to more uniformly process the wafer 200 as compared with a case where the wafer 200 is not rotated.

Second Embodiment of this Present Disclosure

Figure 11:
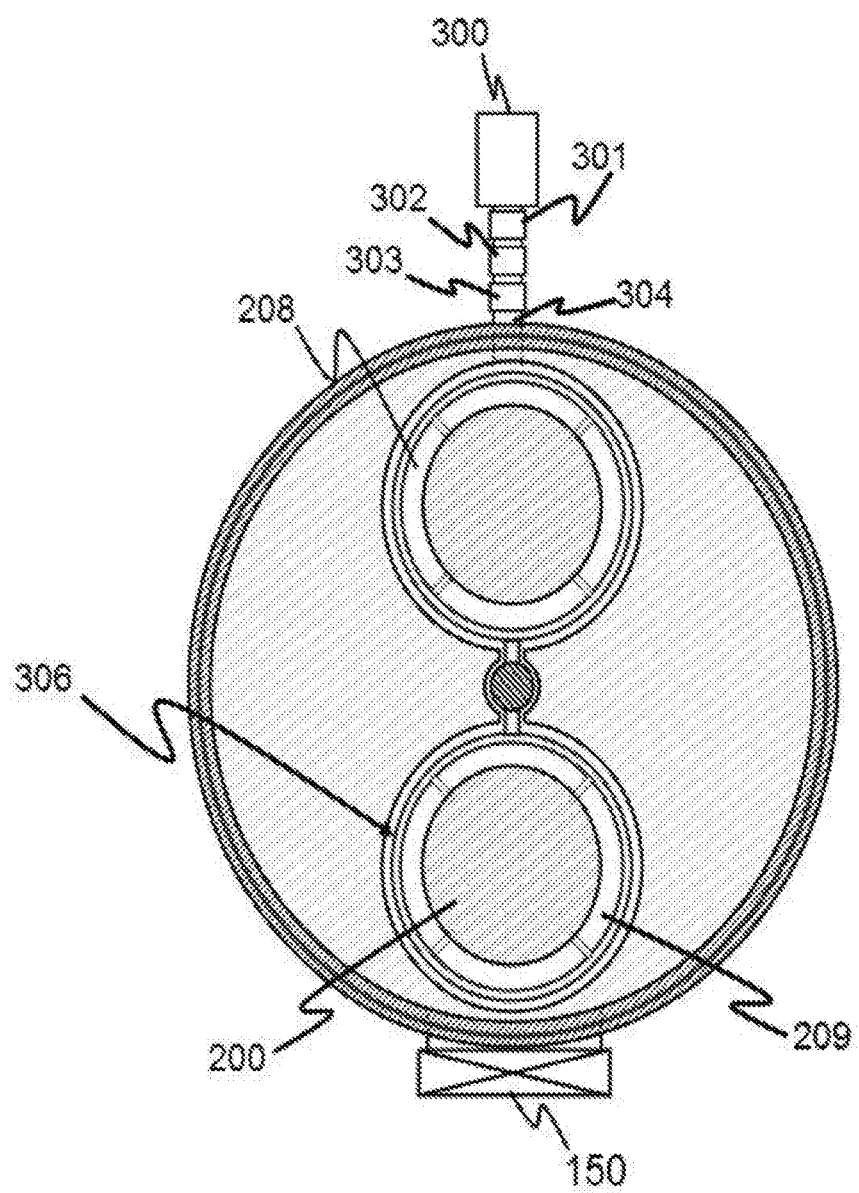
FIG. 11 is a schematic cross-sectional configuration diagram of a single-wafer type process furnace of a substrate processing apparatus that is suitably used in a second embodiment of this present disclosure.

Next, a second embodiment of this present disclosure will be described with reference to FIGS. 11 and 12.

The second embodiment differs from the first embodiment in that one microwave heating chamber 208 and one preheating chamber 209 are provided and a tray 306 rotates by 180° to transfer a wafer 200 so as to perform a preheating process and a microwave heating process. Since the other points are substantially the same as those of the first embodiment, a detailed description thereof will be omitted.

Figure 12:
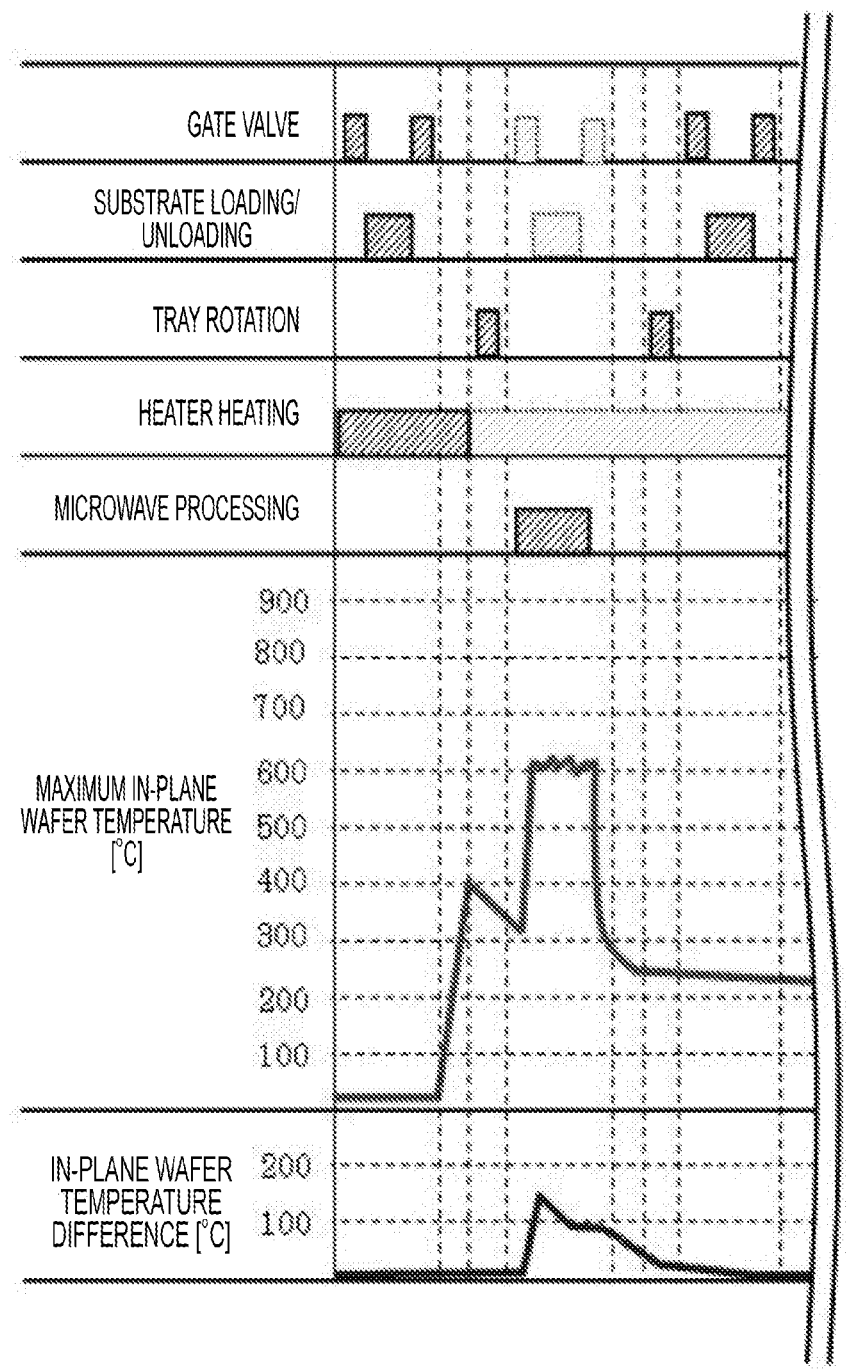
FIG. 12 is a diagram illustrating a substrate processing sequence in an arbitrary substrate processed in the second embodiment of this present disclosure.

As illustrated in FIG. 12, the wafer 200 loaded from a gate valve 150 is placed on the tray 306 disposed in the preheating chamber 209, and the preheating process is performed thereon. The wafer 200 heated to a preheating temperature (100° C. to 450° C.) by performing the preheating is loaded into the microwave heating chamber 208 by the rotation of the tray 306 and the microwave heating process is performed thereon. By performing the microwave heating process, the wafer 200 heated to a reforming processing temperature (300° C. to 700° C.) is reformed. The preheating process and the microwave heating process are described in FIG. 12 as being performed once, but this present disclosure is not limited thereto. As in the first embodiment, the preheating process and the microwave heating process may be alternately performed a predetermined number of times.

With a configuration as in the second embodiment, it is possible to simplify the internal configuration of the process chamber. As the configuration is simplified, the control performed by the controller 160 can be simplified, and thus the substrate processing can be performed more accurately. Since the microwave heating chamber and the preheating chamber can be brought close to each other, the installation area of the apparatus can be reduced.

Third Embodiment of Present Disclosure

Next, a third embodiment of this present disclosure will be described with reference to FIG. 13.

The third embodiment differs from the first embodiment in that: a microwave heating chamber 208 and a preheating chamber 209 are arranged in parallel with each other, whereas the microwave heating chamber 208 and the preheating chamber 209 in the first embodiment are alternately arranged and the wafer 200 held by the tray 306 is transferred by rotating by 90° for each preheating process and microwave heating process; the wafer 200 held by the tray 306 is transferred after rotating by 180° for each preheating process and microwave heating process; and since the microwave heating chamber 208 and the preheating chamber 209 are arranged in parallel, it is possible to load and process the wafers 200 two by two to the gate valve 150. Since the other points are substantially the same as those of the first embodiment, a detailed description thereof will be omitted.

Figure 13:
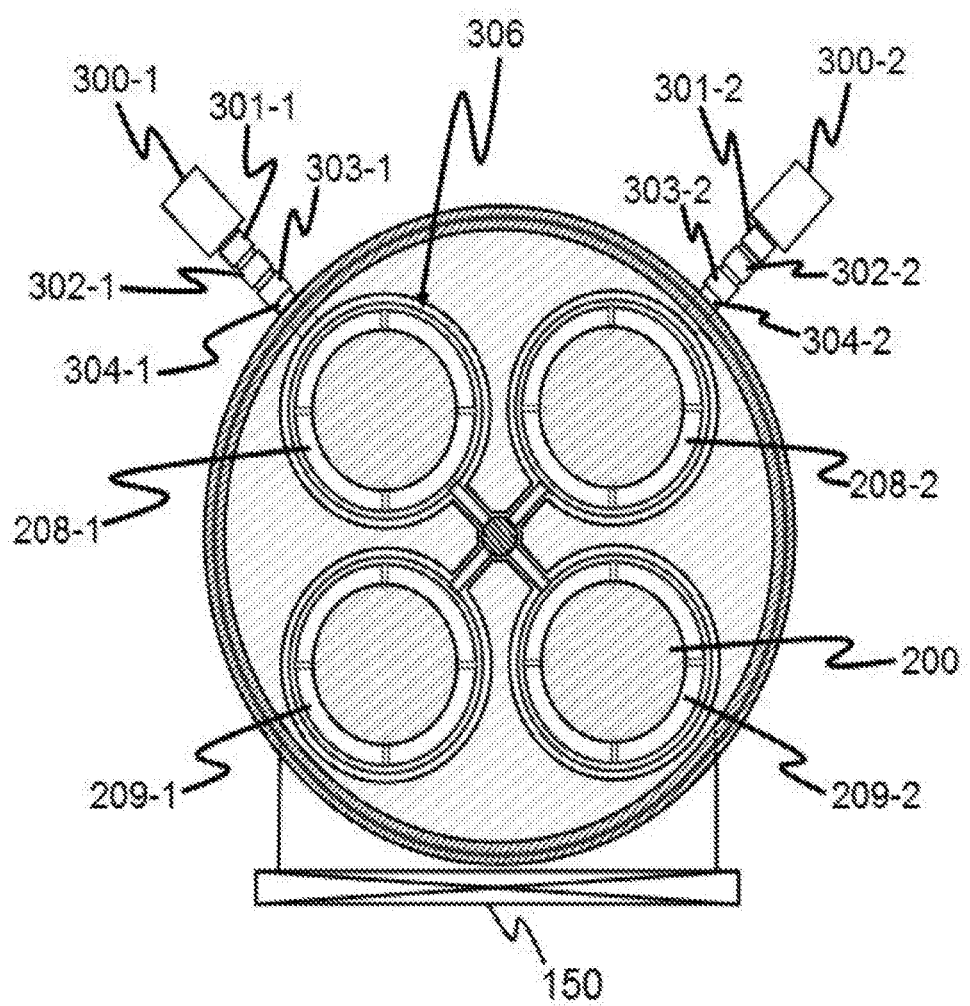
FIG. 13 is a schematic cross-sectional configuration diagram of a single-wafer type process furnace of a substrate processing apparatus that is suitably used in a third embodiment of this present disclosure.

Specifically, as illustrated in FIG. 13, the preheating chambers 209-1 and 209-2 are disposed on the gate valve 150 side, and microwave heating chambers 208-1 and 208-2 are arranged so as to face the preheating chambers 209-1 and 209-2. Two wafers 200 held by a substrate transfer device 112 are loaded into the preheating chambers 209-1 and 209-2 from the gate valve 150 at a time, and a preheating process is performed thereon.

When the preheating process is completed, the tray 306 rotates clockwise by 180°, and the wafer 200 held on the tray 306 and loaded into the preheating chamber 209-1 is transferred to the microwave heating chamber 208-2. The wafer 200 loaded into the preheating chamber 209-2 is transferred to the microwave heating chamber 208-1. Then, the microwave heating processes are performed thereon, respectively. With such a configuration and control, it is possible not only to increase the number of sheets to be processed at one time but also to simplify the control of a plurality of wafer processing. Therefore, the transfer time per wafer is shortened and the throughput is improved.

Although this present disclosure has been described according to the embodiments, each above-described embodiment, each modification example, and the like can be combined as appropriate and the effects thereof can also be obtained.

For example, in each of the above-described embodiments, the process of reforming the amorphous silicon film into the polysilicon film as the film including silicon as the main component has been described, but this present disclosure is not limited thereto. A film formed on the surface of the wafer 200 may be reformed by supplying a gas including at least one of oxygen (O), nitrogen (N), carbon (C), and hydrogen (H). For example, in a case where a hafnium oxide film (HfxOy film) as a high-dielectric-constant film is formed on the wafer 200, deficient oxygen in the hafnium oxide film is supplemented by supplying the microwave while supplying the oxygen-containing gas and heating the oxygen-containing gas, thereby improving characteristics of the high-dielectric-constant film, and an uncrystallized portion in the hafnium oxide film is crystallized by supplying the microwave while supplying the nitrogen gas ($N_2$ gas) and heating the nitrogen gas, thereby improving characteristics of the high-dielectric-constant film.

This present disclosure is not limited thereto and can be preferably applied to the case of forming a metal-based oxide film, that is, an oxide film including at least one metal element of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), and tungsten (W). That is, the above-described film forming sequence can also be preferably applied to the case of forming, on the wafer 200, a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOC film, a MoON film, a MoO film, a WOCN film, a WOC film, a WON film, or a WO film.

In addition, this present disclosure is not limited to the high-dielectric-constant film, and a film including silicon doped with impurities as a main component may be heated. As the film including silicon as the main component, there are a Si-based oxide film such as a silicon nitride film (SiN film), a silicon oxide film (SiO film), a silicon oxycarbide film (SiOC film), a silicon oxycarbonitride film (SiOCN film), or a silicon oxynitride film (SiON film), an epitaxial silicon film (Epi-Si film), an epitaxial silicon germanium film (Epi-SiGe film), and the like. Examples of the impurities include at least one of boron (B), carbon (C), nitrogen (N), aluminum (Al), phosphorus (P), gallium (Ga), and arsenic (As). In addition to the film including silicon as the main component or the metal oxide film described above, an epitaxial germanium film (Epi-Ge film) or a film formed using a group 3-5 element may be heated.

In addition, it may be a resist film based on at least one of a methyl methacrylate resin (polymethyl methacrylate (PMMA)), an epoxy resin, a novolac resin, and a polyvinyl phenyl resin.

In addition, it has been described in the above-described embodiment that the gas supplied from the gas supply system is the inert gas and the substrate processing is the reforming process, but this present disclosure is not limited thereto. A precursor gas that can be formed as a single body, a reactant gas that reacts with the precursor gas, an etching gas that is used for etching, or the like may be supplied to the microwave heating chamber, and a film-forming process or an etching process may be performed thereon.

In addition, one of the processes of manufacturing the semiconductor device has been described above, but this present disclosure is not limited thereto. This present disclosure can also be applied to substrate processing technology such as a patterning process of a liquid crystal panel manufacturing process, a patterning process of a solar cell manufacturing process, or a patterning process of a power device manufacturing process.

INDUSTRIAL APPLICABILITY

As described above, this present disclosure can provide a technology that enables uniform substrate processing.

REFERENCE SIGNS LIST 100 substrate processing apparatus
200 wafer (substrate)
202 process chamber
208 microwave heating chamber (second process chamber)
209 preheating chamber (first process chamber)
300 microwave oscillator
301 isolator
302 directional coupler
303 matcher
304 waveguide
306 tray (susceptor, substrate support portion, substrate placement portion, substrate holding portion)
403 preheating device

The invention claimed is:

1. A substrate processing apparatus comprising:
   a first heating device configured to heat a substrate to a first processing temperature;
   a first process chamber provided with the first heating device;
   a second heating device configured to heat the substrate to a second processing temperature utilizing microwaves, the second processing temperature being higher than the first processing temperature;
   a second process chamber provided with the second heating device;
   a substrate placement portion configured to load and unload the substrate with respect to the first process chamber and the second process chamber by placing and rotating the substrate; and
   a controller configured to respectively control the first heating device, the second heating device, and the substrate placement portion;
   wherein the substrate placement portion is made of a microwave transmitting material that transmits microwaves supplied from the second heating device.

2. The substrate processing apparatus according to claim 1, wherein each of the first process chamber and the second process chamber is provided in plural.

3. The substrate processing apparatus according to claim 1, wherein the substrate is alternately loaded into the first process chamber and the second process chamber and processed therein.

4. The substrate processing apparatus according to claim 1, wherein the substrate placement portion comprises:
   a first substrate support pin configured to support the substrate;
   a plurality of ring connected to the first substrate support pin and having a diameter larger than an outer diameter of the substrate; and
   an arm connected to the plurality of ring and bonding the plurality of ring to each other.

5. The substrate processing apparatus according to claim 1, wherein the controller is configured to control the second heating device such that the second processing temperature becomes a temperature range in which a change in carrier density of the substrate is small.

6. The substrate processing apparatus according to claim 1, wherein the controller is configured to control the first heating device and the second heating device such that the first processing temperature is 100° C. to 450° C. and the second processing temperature is 300° C. to 700° C.

7. The substrate processing apparatus according to claim 1, wherein a substrate rotating unit configured to rotate the substrate is provided in the second process chamber.

8. The substrate processing apparatus according to claim 2, wherein the first process chamber and the second process chamber are alternately disposed.

9. The substrate processing apparatus according to claim 2, wherein the first process chamber and the second process chamber are disposed in parallel with each other.

* * * * *